United States Patent
Nancekievill et al.

(10) Patent No.: US 7,523,421 B1
(45) Date of Patent: Apr. 21, 2009

(54) METHOD AND APPARATUS FOR REDUCING THE COST OF MULTIPLEXER CIRCUITRY

(75) Inventors: Dominic J Nancekievill, West Wycombe (GB); Paul Metzgen, Chiswick (GB)

(73) Assignee: Altera Corporation, San Jose, CA (US)

( * ) Notice: Subject to any disclaimer, the term of this patent is extended or adjusted under 35 U.S.C. 154(b) by 197 days.

(21) Appl. No.: 11/317,096

(22) Filed: Dec. 22, 2005
(Under 37 CFR 1.47)

Related U.S. Application Data

(60) Provisional application No. 60/681,820, filed on May 17, 2005.

(51) Int. Cl.
*G06F 17/50* (2006.01)
(52) U.S. Cl. ............................................... 716/2; 716/3
(58) Field of Classification Search ...................... 716/1, 716/2, 3, 5
See application file for complete search history.

(56) References Cited

U.S. PATENT DOCUMENTS 7,002,370 B1   2/2006   Metzgen et al.

OTHER PUBLICATIONS

Singh et al., "Incremental Placement for Layout-Driven Optimization on FPGAs," IEEE, 2002, pp. 752-759.*
Nancekievill et al., "Factorizing Multiplexers in the Datapath to Reduce Cost in FPGAs," International Workshop on Logic and Synthesis, pp. 423-430 (Jun. 8, 2005).
Metzgen et al., "Multiplexer Restructuring for FPGA Implementation Cost Reduction," Proceedings of the 42nd Design Automation Conference, (Jun. 12, 2005).

* cited by examiner

*Primary Examiner*—Vuthe Siek
(74) *Attorney, Agent, or Firm*—Ropes & Gray LLP; Robert R. Jackson; Chia-Hao La

(57) ABSTRACT

Methods and apparatus are provided for reducing the cost of multiplexer circuitry. Electrically equivalent data inputs and corresponding multiplexers can be eliminated from a multiplexer cone. A new multiplexer and new selection circuitry can be added to preserve the logical function of the cone. Such a method can result in substantial cost savings in the multiplexer circuitry, especially when applied to a multiplexer cone bus of relatively large width.

13 Claims, 6 Drawing Sheets

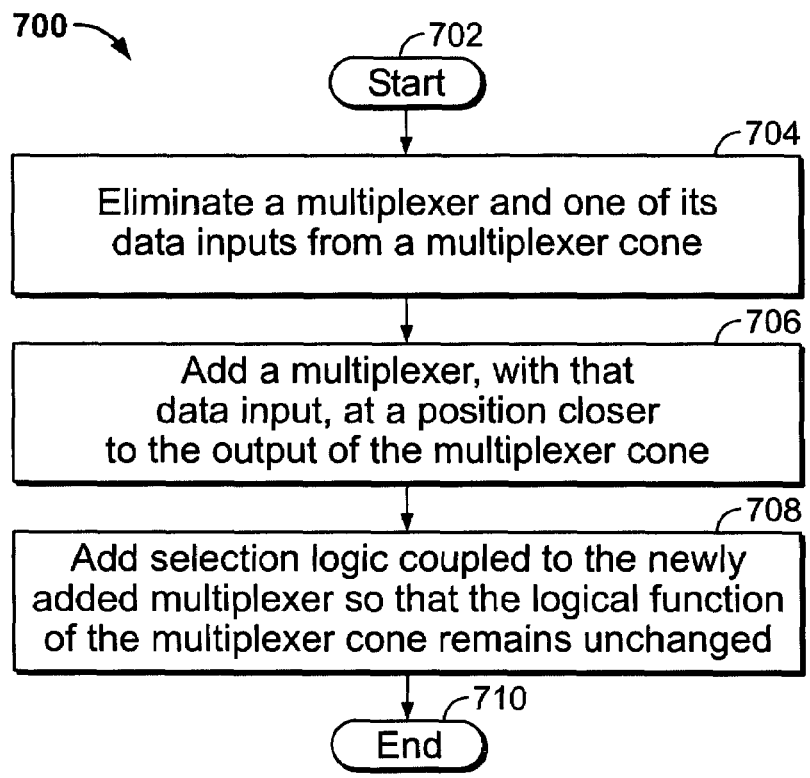
FIG. 7
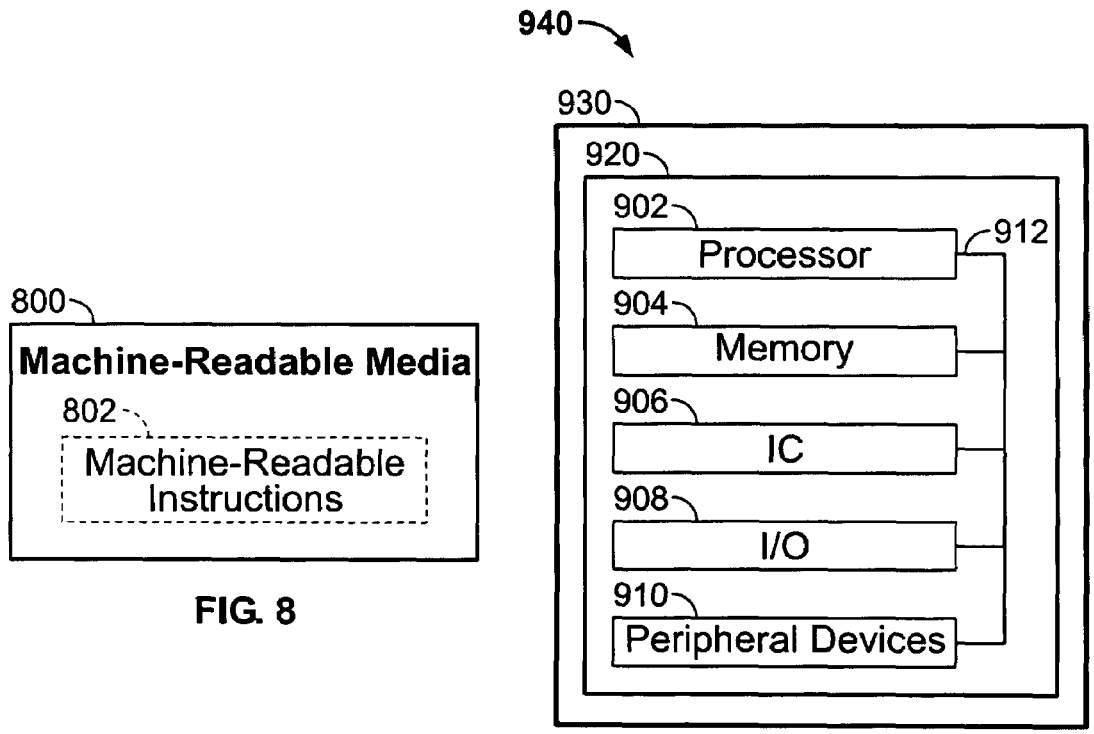
FIG. 8
FIG. 9

US 7,523,421 B1

METHOD AND APPARATUS FOR REDUCING THE COST OF MULTIPLEXER CIRCUITRY

CROSS REFERENCE TO RELATED APPLICATION

This application claims the benefit of provisional application No. 60/681,820, filed May 17, 2005, which is hereby incorporated by reference herein in its entirety.

BACKGROUND OF THE INVENTION

This invention relates to integrated circuits ("ICs"). More particularly, this invention relates to multiplexer circuitry in ICs.

Multiplexers are well-known circuits that accept N selector inputs and $2^N$ data inputs, and generate a single data output. Each binary combination of the N selector inputs will select a corresponding data input and transmit its value to the data output. For simplicity of illustration, the discussion herein will focus on multiplexers with a single selector input, two data inputs, and one data output. However, it will be understood that the concepts discussed herein could be generalized to accommodate N selector inputs and $2^N$ data inputs.

Multiplexers are used extensively in ICs, and are especially common in the datapaths of programmable logic devices ("PLDs"). Such datapaths often include "multiplexer cones," which are composed of a plurality of multiplexers feeding into each other. That is, the output of each multiplexer is coupled to a data input of another multiplexer, with the exception of the final multiplexer in the cone, which typically drives a register or other output circuitry. Because datapaths often consist of multiple bits, PLDs typically include many "multiplexer cone buses," which are collections of multiplexer cones that are isomorphic to each other and share the same selector inputs. In addition, wherever a pair of data inputs are electrically equivalent in one multiplexer cone, they are also equivalent in the other cones of the same bus, a property that will become significant later herein.

Because of the prevalence of multiplexer circuitry in ICs, and in PLDs in particular, it is highly desirable to find algorithms that can reduce the cost (e.g., area) of multiplexer circuitry. Such reduction can be achieved, for example, during synthesis, where software code that is written in a hardware description language ("HDL") is converted into a circuit configuration that can be implemented on an IC. Modern synthesis algorithms typically optimize multibit datapaths one bit at a time. As a result, some optimizations that can yield savings if applied across an entire multiplexer cone bus, but not if applied to individual multiplexer cones, are not used.

In view of the foregoing, it would be desirable to provide methods and apparatus that can reduce the cost of multiplexer circuitry. In particular, it would be desirable to provide methods and apparatus that can reduce the cost of multiplexer cone buses.

SUMMARY OF THE INVENTION

In accordance with this invention, methods and apparatus are provided for reducing the cost of multiplexer circuitry. In one embodiment of the invention, a multiplexer cone can be restructured. A first multiplexer and one of its data inputs can be eliminated from a first point of the multiplexer cone. A second multiplexer can be added to a second point in the multiplexer cone that is closer to an output of the multiplexer cone than the first point. The data input of the first multiplexer can be received by the second multiplexer. In addition, selection logic that is coupled to the second multiplexer can be added, such that the logical function of the multiplexer cone remains unchanged by the restructuring process.

In another embodiment of the invention, multiplexer circuitry in a multiplexer cone can be factorized. Electrically equivalent data inputs and corresponding multiplexers in the multiplexer cone can be selected and eliminated. A new multiplexer can be added in the multiplexer cone bus, such that the new multiplexer receives at least one of the data inputs. New selection circuitry can be added and coupled to the new multiplexer.

In yet another embodiment of the invention, the cost of multiplexer circuitry can be reduced. A plurality of maximal multiplexer cones can be found in the multiplexer circuitry and merged into at least one maximal multiplexer cone bus. An optimization can be applied to the at least one maximal multiplexer cone bus that reduces the cost of the multiplexer circuitry, even though it would not reduce the cost if applied only to a single maximal multiplexer cone.

The invention therefore advantageously provides methods and apparatus for reducing the cost of multiplexer circuitry. In particular, the methods and apparatus of the invention can be used to reduce the cost of multiplexer cone buses.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 7 is a flow diagram showing a method for restructuring a multiplexer cone in accordance with an embodiment of the invention;

FIG. 8 is a block diagram of illustrative machine-readable media in accordance with an embodiment of the invention; and FIG. 9 is a block diagram of a data processing system incorporating the invention.

DETAILED DESCRIPTION OF THE INVENTION

Figure 1:
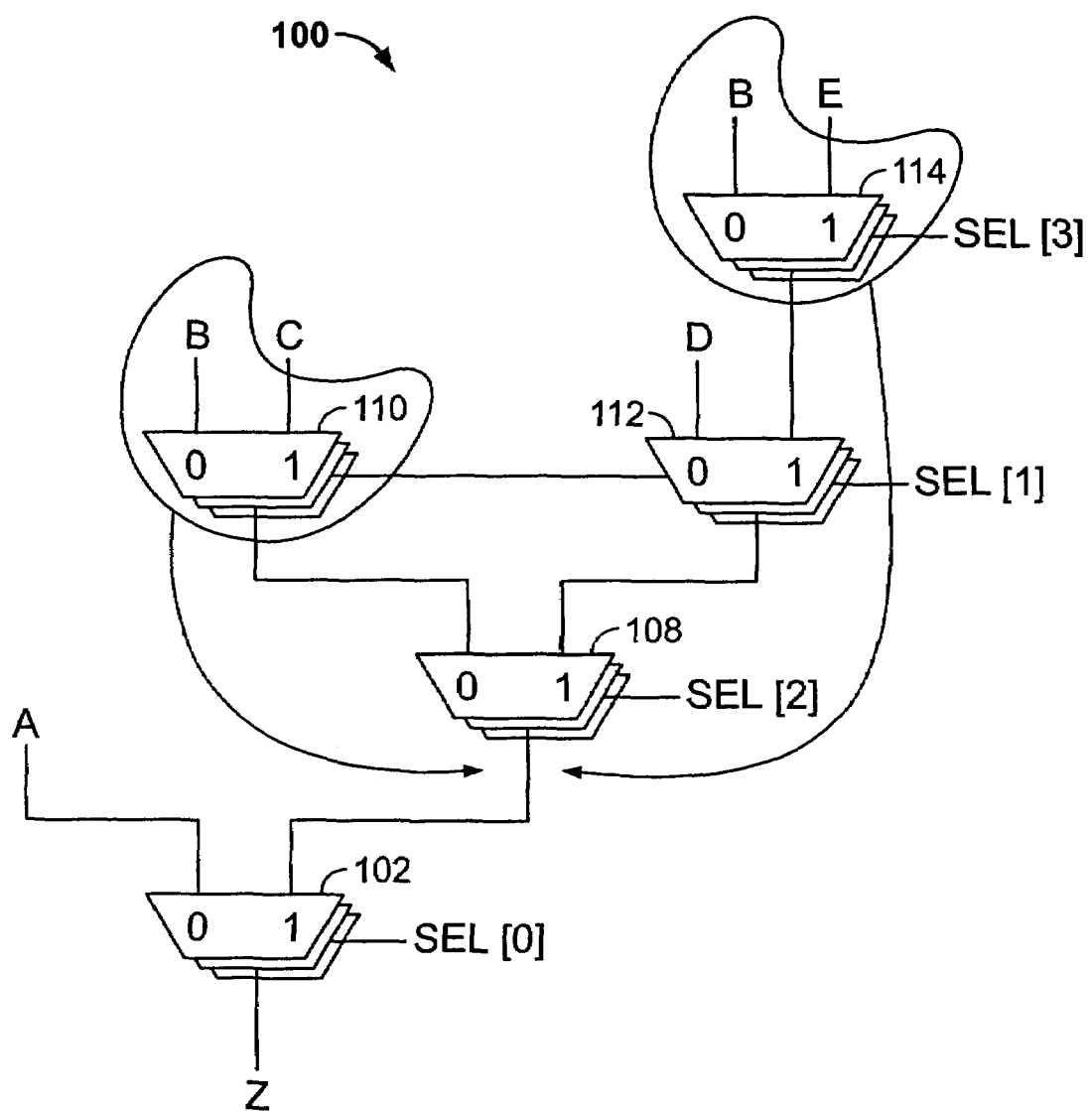
FIG. 1 is a circuit diagram showing illustrative multiplexer circuitry in accordance with an embodiment of the invention.

FIG. 1 is a circuit diagram showing illustrative multiplexer circuitry in accordance with an embodiment of the invention. As used herein, a "multiplexer cone bus" is defined as a plurality of multiplexer cones, where two cones are members of the same bus if and only if: (1) they have an isomorphic arrangement of multiplexers; (2) they are controlled by the same selector inputs; and (3) wherever a pair of data inputs are electrically equivalent in one cone, the data inputs in the corresponding positions in the other cone are also electrically equivalent. In addition, a "multiplexer cone" is defined as a plurality of multiplexers in which the output of each multiplexer in the cone is a data input for another multiplexer in the cone, with the exception of the final multiplexer.

In FIG. 1, multiplexer cone bus 100 includes three multiplexer cones. It should be noted that the configuration of multiplexer cone bus 100 is used merely for purposes of illustration, and the concepts of the invention can be applied to multiplexer cone buses of other topologies and widths. Multiplexer cone bus 100 receives data input buses A, B, C, D, and E, and generates data output bus Z. Each of data buses A, B, C, D, E, and Z preferably includes three single-bit component signals. The value of data output bus Z is controlled by four-bit selector input bus SEL.

Multiplexers 114 receive data inputs B and E, as well as selector input SEL[3]. As described above, each of data inputs B and E preferably includes three distinct data bits, one for each multiplexer 114. In contrast, signal SEL[3] is preferably a single-bit signal that controls all three multiplexers 114, as required by the definition of a multiplexer cone bus. Thus, when SEL[3] carries a logical "0" value, each multiplexer 114 preferably outputs a distinct bit of signal bus B. Similarly, when SEL[3] carries a logical "1" value, each multiplexer 114 preferably outputs a distinct bit of signal bus E.

The output of each multiplexer 114 is coupled to a data input of a multiplexer 112, which also receives a component bit of data input bus D. All three multiplexers 112 are preferably controlled by selector input SEL[1]. Selector input SEL[1] also preferably controls multiplexers 110, whose data inputs are signal buses B and C. It will be noted that data input bus B is preferably received by multiplexers 110 and multiplexers 114. That is, a data input of each multiplexer 110 is electrically equivalent to a data input of each multiplexer 114, a fact that will become significant later herein.

Proceeding further down the cone, the outputs of multiplexers 110 and 112 are received by multiplexers 108, which are controlled by selector input SEL[2]. The outputs of multiplexers 108 are received by multiplexers 102, which generates output signal Z. Multiplexers 108 also receive data inputs A, and are controlled by selector input SEL[0].

The cost of multiplexer cone bus 100 can be reduced in accordance with the invention by restructuring its circuitry appropriately. As noted before, data input bus B is received by both multiplexers 110 and multiplexers 114. This redundancy can be exploited by eliminating multiplexers 114, multiplexers 110, and their connections to data input bus B, and adding new circuitry. As suggested by FIG. 1, the new circuitry can be added between multiplexers 108 and multiplexers 102. This collection of restructuring steps is referred to as "factorization," and is illustrated in more detail below.

Figure 2:
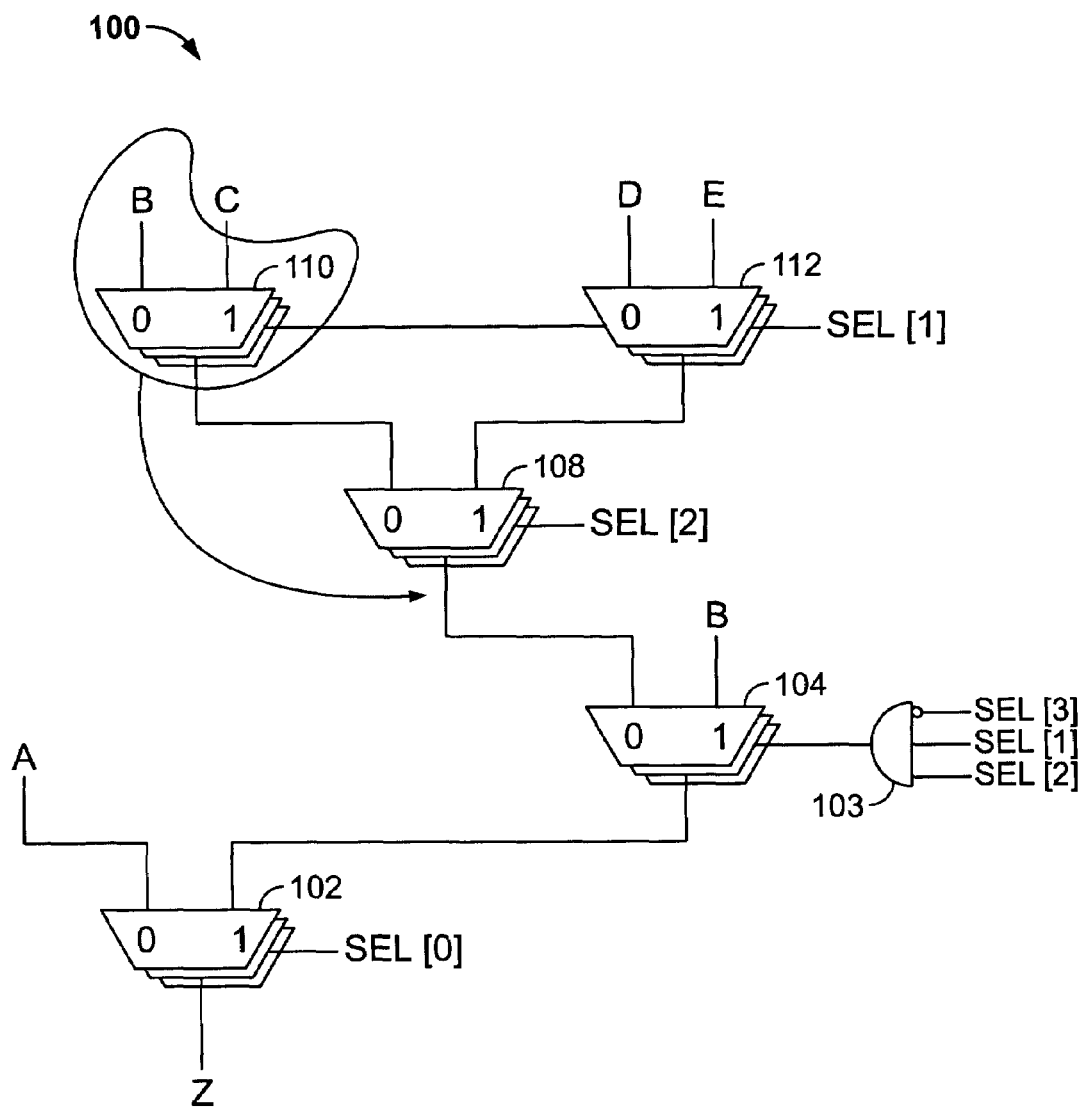
FIG. 2 is a circuit diagram showing a first factorization step of the multiplexer circuitry of FIG. 1 in accordance with an embodiment of the invention.

FIG. 2 is a circuit diagram showing a first factorization step of the multiplexer circuitry of FIG. 1 in accordance with an embodiment of the invention. Multiplexers 114 of FIG. 1 have been eliminated, along with their data input bus B. As a result, data input bus E is received directly by multiplexers 112. In order to preserve the logical function of multiplexer cone bus 100, multiplexers 104 have been added between multiplexers 108 and multiplexers 102. The data outputs of multiplexers 108 are received by multiplexers 104. In addition, multiplexers 104 receive data input bus B. The outputs of multiplexers 104 are received by multiplexers 102.

In an abstract sense, multiplexers 114 and their respective component data inputs of bus B have been moved to a new point in multiplexer cone bus 100. To account for this change in topology, selection logic 103 is added. Preferably, selection logic 103 includes an AND gate, and receives the logical inverse of selector input SEL[3], as well as non-inverted selector inputs SEL[1] and SEL[2]. The output of selection logic 103 preferably controls and is received by all three multiplexers 104. It will be noted that the logical function of multiplexer cone bus 100 has been unchanged by the illustrated restructuring. For instance, multiplexer cone bus 100 still outputs data input bus B when SEL[0] is a logical "1," SEL[2] is a logical "1," SEL[L] is a logical "1," and SEL[3] is a logical "1." Further inspection of the circuits illustrated in FIGS. 1 and 2 will reveal that all possible binary values of selector input bus SEL generate the same values of output bus Z, despite the restructuring. As suggested earlier, a similar restructuring operation can be performed with respect to multiplexers 110 and their data input bus B, as shown in FIG. 3.

Figure 3:
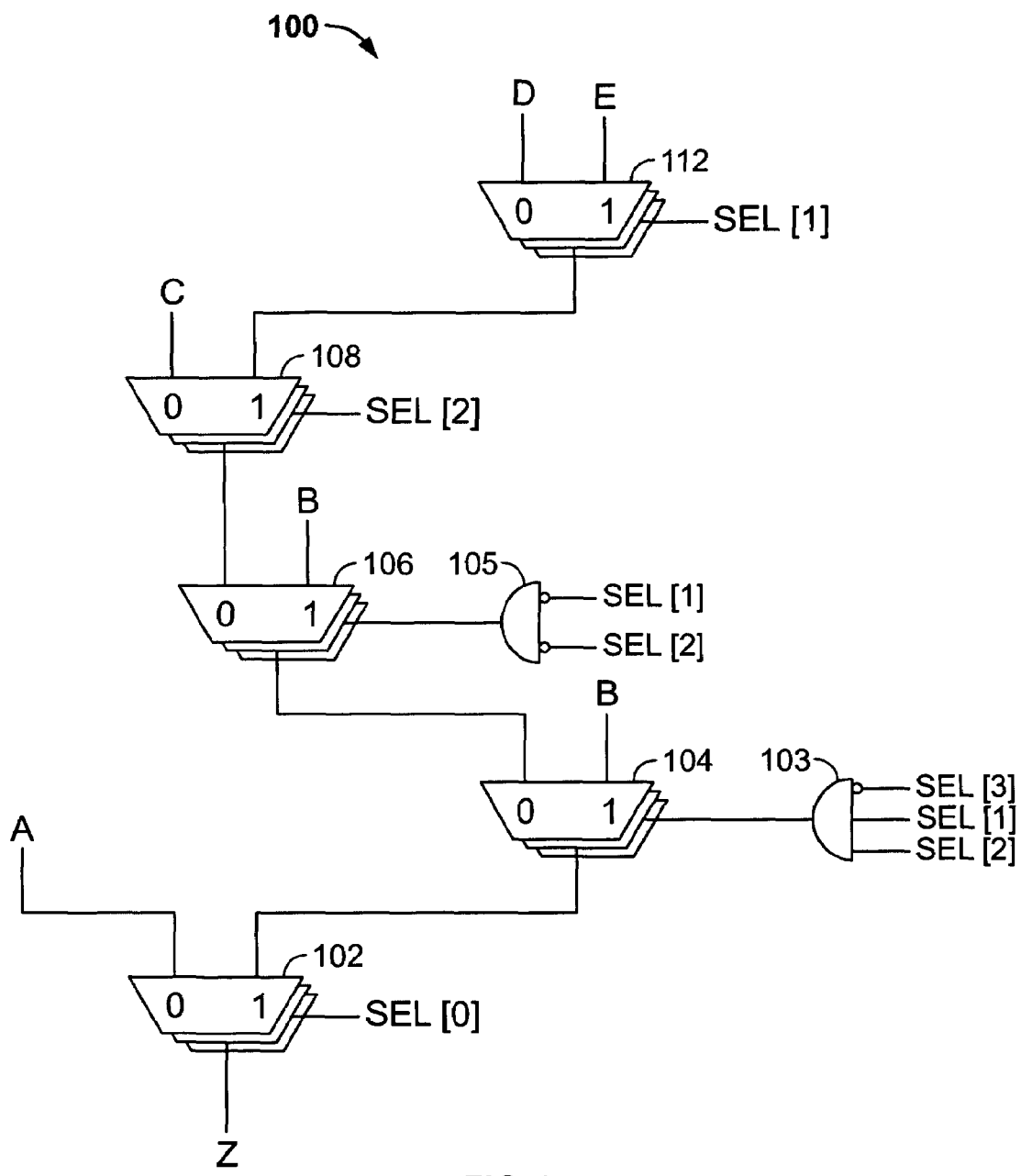
FIG. 3 is a circuit diagram showing a second factorization step of the multiplexer circuitry of FIG. 1 in accordance with an embodiment of the invention.

FIG. 3 is a circuit diagram showing a second factorization step of the multiplexer circuitry of FIG. 1 in accordance with an embodiment of the invention. In FIG. 3, multiplexers 110 of FIG. 2 have been eliminated, along with their data input bus B. As a result, data input bus C is received directly by multiplexers 108. In order to preserve the logical function of multiplexer cone bus 100, multiplexers 106 have been added between multiplexers 108 and multiplexers 104. The data outputs of multiplexers 108 are received by multiplexers 106. In addition, multiplexers 106 receive data input bus B. The outputs of multiplexers 106 are received by multiplexers 104.

Selection logic 105 is added in order to account for this further restructuring of multiplexer cone bus 100. Preferably, selection logic 105 includes an AND gate, and receives the logical inverse of selector input SEL[1], as well as the logical inverse of selector input SEL[2]. The output of selection logic 105 preferably controls and is received by all three multiplexers 106. It will be noted that the logical function of multiplexer cone bus 100 has again been unchanged by the illustrated restructuring. As was the case in FIGS. 1 and 2, multiplexer cone bus 100 still outputs data input bus B when SEL[0] is a logical "1," SEL[2] is a logical "0," and SEL[L] is a logical "1." Further inspection of the circuits illustrated in FIGS. 1, 2, and 3 will reveal that all possible binary values of selector input bus SEL generate the same values of output bus Z, despite the restructuring.

It should be noted that the two restructuring steps described above in connection with FIGS. 2 and 3 have actually increased the cost of multiplexer cone bus 100. The total number of multiplexers remains unchanged, and additional selection logic 103 and 105 has been added. However, multiplexer cone bus 100 can be further modified upon noticing that multiplexers 104 and multiplexers 106 serve substantially similar functions. That is, they effectively select between data input bus B and the output of multiplexers 108. As such, their functionality can be collapsed into a single set of three multiplexers, with a corresponding adjustment in selection logic.

Figure 4:
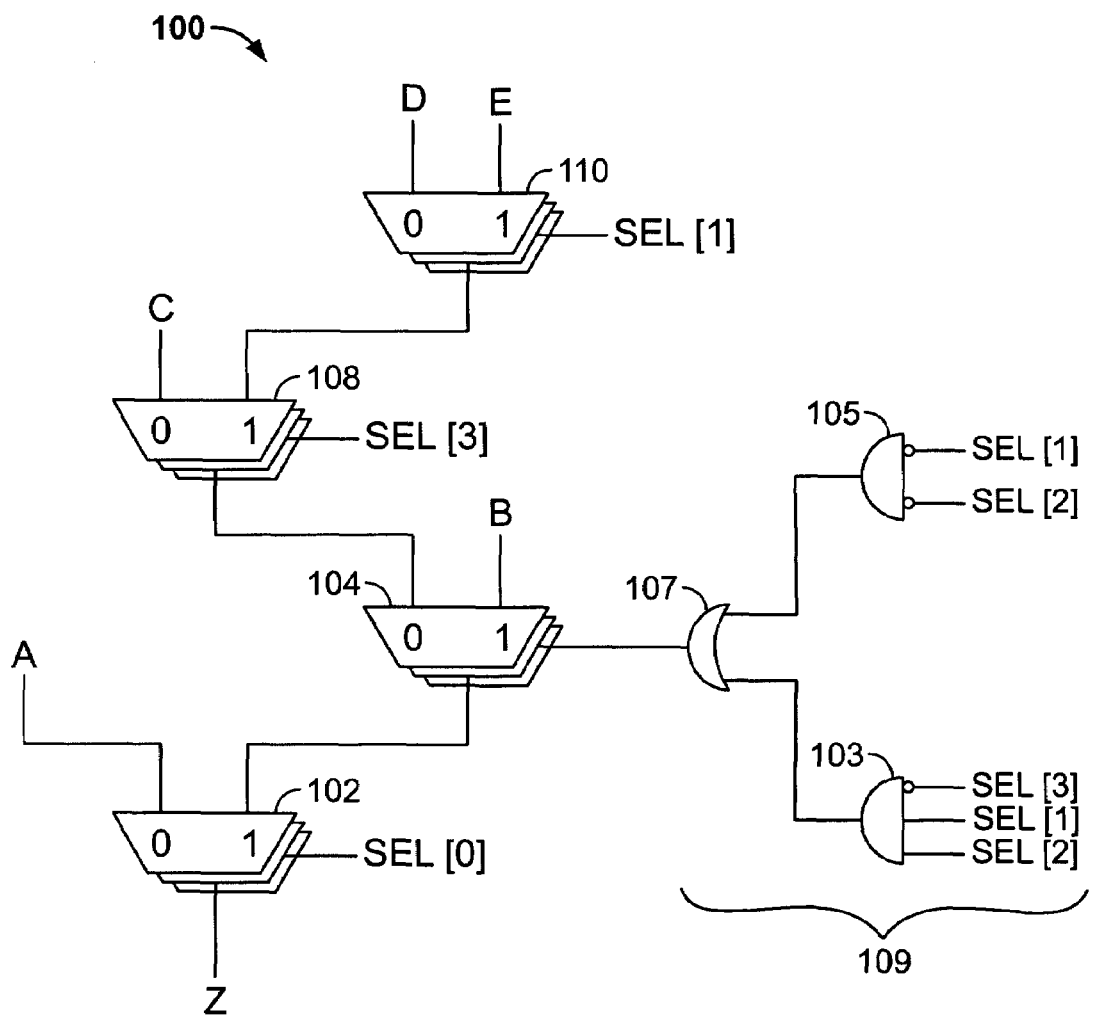
FIG. 4 is a circuit diagram showing a third factorization step of the multiplexer circuitry of FIG. 1 in accordance with an embodiment of the invention.

FIG. 4 is a circuit diagram showing a third factorization step of the multiplexer circuitry of FIG. 1 in accordance with an embodiment of the invention. Multiplexers 106 have been eliminated, along with their data input bus B and selection logic 105. As a result, the outputs of multiplexers 108 are received directly by multiplexers 104. In addition, the selection logic of 104 has been modified. The new selection logic 109 of multiplexers 104 preferably includes both selection logic 105 and selection logic 103, as well as new OR gate 107. Selection logic 109 generates a single selector input, which preferably controls and is received by all three multiplexers 104. As before, it will be noted that the logical function of multiplexer cone bus 100 has been unchanged.

The various restructuring steps illustrated in FIGS. 1-4 are collectively referred to as "factorization." It will be noted that the steps described are for purposes of illustration only. For example, an implementation of the invention preferably bypasses the intermediate stages illustrated by FIGS. 2 and 3. Instead, the invention can preferably be achieved by simply eliminating multiplexers 114 and multiplexers 110, as well as their data input buses B, and adding multiplexers 104 and selection logic 109, where multiplexers 104 receive data input bus B.

In comparing the circuitry depicted in FIG. 1 with that depicted in FIG. 4, it will be noted that the number of multiplexers has been reduced by three. However, it will also be noted that selection logic 109 has been added. At first glance, it may be hard to determine whether the cost of multiplexer cone bus 100 has in fact been increased or decreased by the factorization. The effect of factorization on the cost of multiplexer cone bus 100 can be determined as follows.

First, an approximate cost of each multiplexer can be determined. A multiplexer with two data inputs ("2:1 multiplexer") can typically be implemented using a single four-input lookup table ("4LUT"), a standard building block in PLDs. The inputs of the 4LUT include the two data inputs and the selector input of the 2:1 multiplexer.

It is well-known in the art that a multiplexer with four data inputs ("4:1 multiplexer") can be implemented with three 2:1 multiplexers, with the outputs of two 2:1 multiplexers coupled to the data inputs of the third. Thus, a 4:1 multiplexer can easily be implemented using three 4LUTs. However, in some cases it is possible to implement a 4:1 multiplexer with only two 4LUTs. An example of such an implementation is described in U.S. patent application Ser. No. 10/728,645, filed Dec. 4, 2003, which is hereby incorporated by reference herein in its entirety. In general, the number of 4LUTs required to implement a multiplexer cone can depend on the particular implementation and topology of the cone. However, in light of the above discussion, the cost $C_{CONE}$ of a multiplexer cone that contains m 2:1 multiplexers can be bounded as follows:

$$\frac{2}{3}m \le C_{CONE} \le m$$

It follows that the cost $C_{2:1}$ of a 2:1 multiplexer in a multiplexer cone ranges from approximately ⅔ to approximately 1. Thus, as a conservative estimate, the lower bound of $C_{2:1}$ can be approximated as follows:

$$C_{2:1} \approx \frac{2}{3}$$

The cost reduction $R_{MUX}$ achieved by factorizing a multiplexer bus cone of width W can be expressed as follows, taking advantage of the conservative estimate of $C_{2:1}$ derived above:

$$R_{MUX} = C_{2:1}W \approx \frac{2}{3}W$$

Second, an approximate cost of the selection logic required by a given factorization can be determined. In the illustrative example shown in FIG. 4, the selection logic preferably includes an OR gate, coupled to the outputs of two AND gates. Each AND gate preferably receives $N_1$ or $N_2$ inputs, where $N_1$ is the number of multiplexers between the original point of the first restructured data input and the final point of that input, and $N_2$ is the number of multiplexers between the original point of the second restructured data input and the final point of that input. In the illustrative example shown in FIG. 4, $N_1=3$ and $N_2=2$. Using 4LUTs to implement the required logical AND and OR functions, it can be shown that an upper bound of the cost $C_{SELECTION}$ of the selection logic can be approximated as:

$$C_{SELECTION} \approx \frac{N_1 + N_2}{3}$$

If we let d be the average of $N_1$ and $N_2$ (that is, the average "distance traveled" by the electrically equivalent data inputs), $C_{SELECTION}$ can be rewritten as follows:

$$C_{SELECTION} \approx \frac{2}{3}d$$

of course, the computation of the cost of selection logic will vary according to the specific implementation techniques applied, and the above estimate is used for purposes of illustration only.

Having expressed the cost reduction $R_{MUX}$ obtained by eliminating multiplexers and the cost $C_{SELECTION}$ of the added selection logic, the net cost reduction can be approximated as follows:

$$R = R_{MUX} - C_{SELECTION} \approx \frac{2}{3}(W - d)$$

Thus, according to the approximations described above, factorization will yield a net cost savings if the width of the multiplexer cone bus is greater than the average distance traveled by the restructured data inputs. Such a result is consistent with the observation that factorization will be most effective when the width of the multiplexer cone bus is relatively high and the cost of the selection logic is relatively low. Viewed another way, each multiplexer cone in the bus can yield additional cost savings in the form of more eliminated multiplexers, while the selection logic can be used across all multiplexer cones in the bus, and can therefore be seen as a sort of one-time expense.

Figure 5:
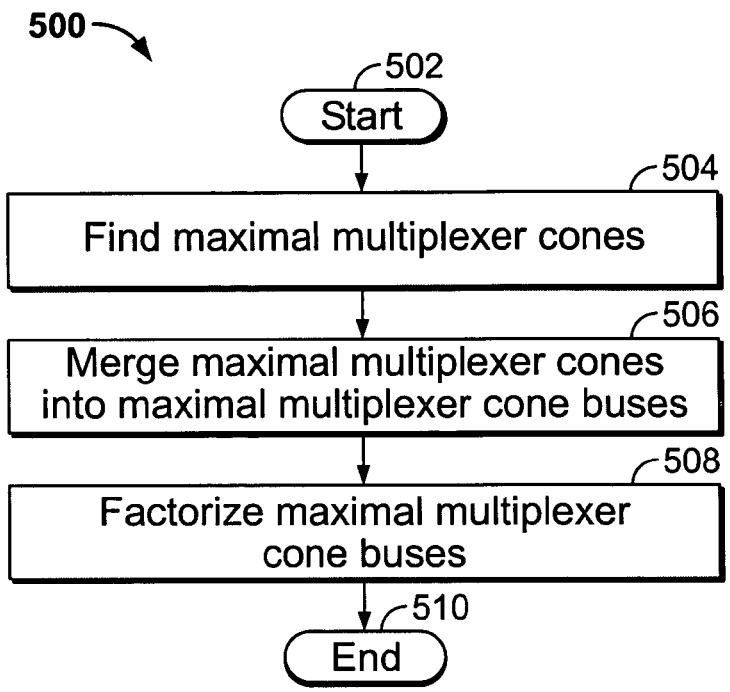
FIG. 5 is a flow diagram showing a method for reducing the cost of multiplexer circuitry in accordance with an embodiment of the invention.

FIG. 5 is a flow diagram showing a method 500 for reducing the cost of multiplexer circuitry in accordance with an embodiment of the invention. The method can be used as a part of synthesis algorithms that convert hardware description language ("HDL") software code into a circuit configuration that can be implemented on an IC, and starts at step 502. At step 504, maximal multiplexer cones are preferably found in the multiplexer circuitry. As used herein, a "maximal multiplexer cone" is defined as a multiplexer cone where no more multiplexers of the circuitry can be added to the cone. In an embodiment of the invention, maximal multiplexer cones can be found by listing all 2:1 multiplexers in the circuitry in reverse depth order, meaning that those closest to an output are closest to the beginning of the list. Then, the list is preferably scanned, and each multiplexer whose output is received by another 2:1 multiplexer in a multiplexer cone is preferably added to that multiplexer cone. Each multiplexer whose output is not received by another 2:1 multiplexer in a multiplexer cone is preferably treated as the first member of a new multiplexer cone.

At step 506, the maximal multiplexer cones found in step 504 are preferably merged into maximal multiplexer cone buses. As used herein, a "maximal multiplexer cone bus" is a multiplexer cone bus (1) whose multiplexer cones are all maximal, and (2) to which no more multiplexer cones can be added. In an embodiment of the invention, maximal multiplexer cones can be merged into buses by computing an index for each maximal multiplexer cone, where the indices of maximal multiplexer cones that belong to the same maximal multiplexer cone bus are equal. Then, maximal multiplexer cone buses of maximal width are preferably found by sorting the maximal multiplexer cones according to their computed indices, and merging cones with equal indices into the same bus.

At step 508, the maximal multiplexer cones of step 506 are preferably factorized, using a technique such as that illustrated in FIGS. 1-4. The method ends at step 510. Because method 500 tends to achieve relatively good results when multiplexer cone buses are relatively wide, method 500 is preferably applied before other synthesis optimizations. In particular, method 500 is preferably applied before any optimization that might alter the topology of distinct multiplexer cones of the same multiplexer cone bus in different ways, thereby reducing the width of possible multiplexer cone buses.

Figure 6:
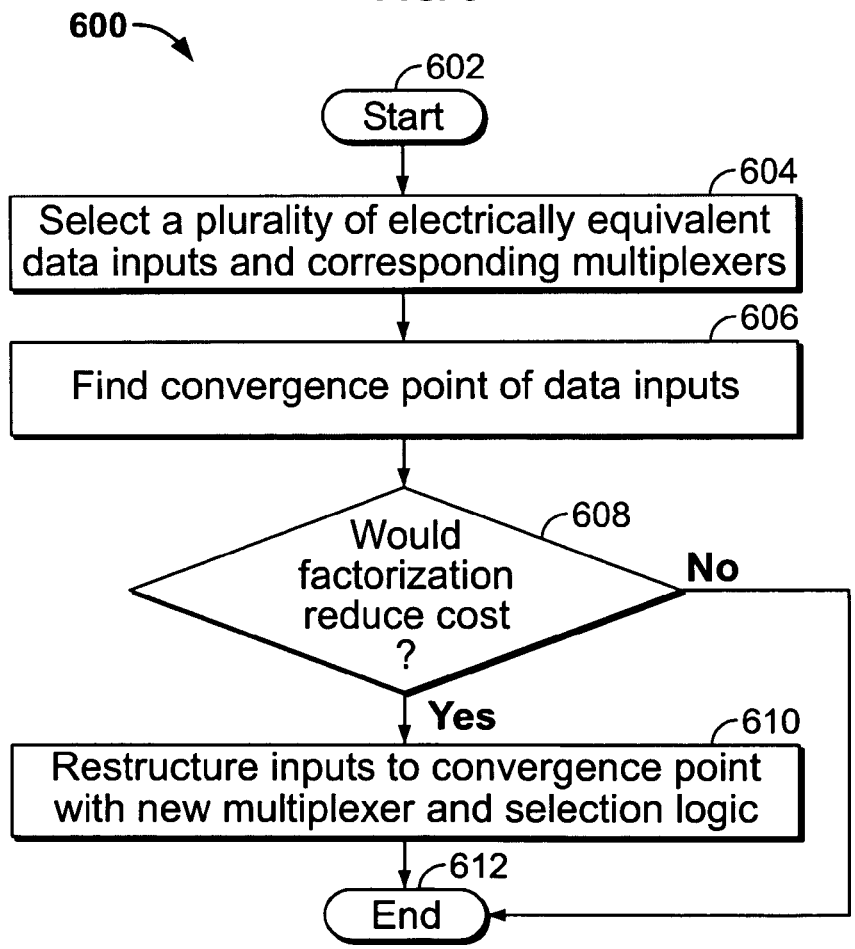
FIG. 6 is a flow diagram showing a method for factorizing a multiplexer cone in accordance with an embodiment of the invention.

FIG. 6 is a flow diagram showing a method 600 for factorizing a multiplexer cone in accordance with an embodiment of the invention. Method 600 can be applied to individual multiplexer cone buses in factorizing step 508 in method 500, and starts at step 602. At step 604, a plurality of electrically equivalent data inputs and corresponding multiplexers are preferably selected. In the example shown in FIGS. 1-4, multiplexers 110 and 114, along with the corresponding data inputs B, are selected.

Next, method 600 preferably finds a point to which the selected data inputs can be restructured. This point is preferably between each of the selected data inputs and an output of the multiplexer cone bus. As shown in step 606, this point is preferably the convergence point of the data inputs. As used herein, a "convergence point" is defined as the point in the multiplexer cone that is farthest away from an output of the cone, and which lies between the output and each of the selected data inputs. Restructuring the data inputs to the convergence point will minimize d, the average distance traveled by the selected data inputs during factorization. As discussed above, minimizing d can result in maximizing cost savings from factorization.

At step 608, it is preferably determined whether or not factorization of the selected data inputs would reduce the cost of the multiplexer circuitry to which method 600 is applied. Although method 600 is described herein chiefly in connection with a multiplexer cone, it will be noted that such an algorithm is ideally applied to multiplexer cone buses. As discussed above, one way to determine if factorization would reduce the cost of a multiplexer cone bus is to compare the width W of the bus to the average distance d that is traveled by the selected data inputs. If W is greater than d, factorization may reduce overall cost. On the other hand, if w is less than d, factorization may not reduce overall cost.

If it is determined that factorization will reduce the cost of the multiplexer cone, the selected data inputs are preferably restructured to the convergence point at step 610, with the addition of the appropriate new multiplexer and selection logic, as illustrated by the example in FIG. 4. After the completion of step 610, the method preferably ends at step 612. On the other hand, if it is determined that factorization will not reduce the cost of the multiplexer cone, the method preferably ends at step 612 without any restructuring.

FIG. 7 is a flow diagram showing a method 700 for restructuring a multiplexer cone in accordance with an embodiment of the invention. Method 700 can be used as part of step 610 of method 600, and starts at step 702. At step 704, a multiplexer and one of its data inputs is preferably eliminated from the multiplexer cone. For example, the example illustrated in FIGS. 1 and 2 eliminates each of multiplexers 114 and its corresponding component data input B.

At step 706, a multiplexer is preferably added at a position closer to the output of the multiplexer cone. The added multiplexer preferably receives the same data input that was previously eliminated. For example, each of multiplexers 104 is added in FIG. 2, and receives a corresponding component data input B, which was previously eliminated along with each of multiplexers 114.

At step 708, selection logic is preferably added and coupled to the newly added multiplexer, so that the logical function of the multiplexer cone remains unchanged. For example, AND gate 103 is added in FIG. 2, and accepts appropriately inverted or non-inverted selection inputs, such that the logical function of multiplexer cone 100 remains substantially unchanged. That is, any binary combination of selector input bits SEL generates the same output value Z both before and after the restructuring is performed.

The invention therefore advantageously reduces the cost of multiplexer circuitry. In particular, the invention can dramatically reduce the cost of multiplexer cone buses, where the cost savings increase with the width of the multiplexer cone bus. Selection logic, whose cost does not increase with the width of the multiplexer cone bus, can be added to preserve the logical function of the bus. The invention therefore is particularly effective when applied to multiplexer cone buses of relatively large width, but is not limited to such buses.

It will be noted that other embodiments of the invention aside from those described above could be used without deviating from the spirit or scope of the invention. For instance, FIG. 4 illustrates selection circuitry 109 with a logical OR gate, which receives outputs of two logical AND gates. Such an implementation was shown merely as a logical illustration, and actual implementations may vary. For example, the discussion above described an implementation using a plurality of 4LUTs. The selection logic can also be implemented with other logic gates, such as logical NAND gates and logical NOR gates. In addition, the example of FIGS. 1-4 illustrated factorization in connection with only two sets of multiplexers, namely, multiplexers 110 and multiplexers 114. It will be noted that the invention can also be applied to factorizations that include a greater number of multiplexer sets, with appropriate additions to the added selection logic.

FIG. 8 illustrates another possible aspect of the invention. Machine-readable media 800 (e.g., magnetic disc(s), optical disc(s), magnetic tape(s), or the like) is encoded with machine-readable instructions 802 (e.g., a computer program) for at least partly performing one or more methods according to the invention.

FIG. 9 illustrates an IC 906, which incorporates multiplexer circuitry whose cost is reduced in accordance with this invention, in a data processing system 940. IC 906 may be a PLD, an application-specific IC ("ASIC"), or a device possessing characteristics of both a PLD and an ASIC. Data processing system 940 may include one or more of the following components: processor 902; memory 904; I/O circuitry 908; and peripheral devices 910. These components are coupled together by a system bus 912 and are populated on a circuit board 920 which is contained in an end-user system 930.

System 940 can be used in a wide variety of applications, such as computer networking, data networking, instrumentation, video processing, or digital signal processing. IC 906 can be used to perform a variety of different logic functions. For example, IC 906 can be configured as a processor or controller that works in cooperation with processor 902. IC 906 may also be used as an arbiter for arbitrating access to a shared resource in system 940. In yet another example, IC 906 can be configured as an interface between processor 902 and one of the other components in system 940.

Thus it is seen that methods and apparatus are provided for reducing the cost of multiplexer circuitry. One skilled in the art will appreciate that the invention can be practiced by other than the described embodiments, which are presented for purposes of illustration and not of limitation, and the present invention is limited only by the claims which follow.

What is claimed is:

1. A method of restructuring a multiplexer cone, said method comprising:
   eliminating a first multiplexer and a data input of said multiplexer from a first point of said multiplexer cone;
   adding a second multiplexer at a second point in said multiplexer cone, wherein said second point is closer to an output of said multiplexer cone than said first point and said second multiplexer receives said data input; and
   adding selection logic coupled to said second multiplexer so that a logical function of said multiplexer cone remains unchanged by said eliminating, said adding said second multiplexer, and said adding said selection logic.

2. The method of claim 1 wherein said first point and said second point are separated by at least one multiplexer.

3. The method of claim 2 wherein said selection logic receives a selector input of each said at least one multiplexer.

4. The method of claim 3 wherein said selection logic further receives a selector input of said first eliminated multiplexer.

5. The method of claim 1 wherein said first and second multiplexers are 2:1 multiplexers.

6. The method of claim 1 wherein said multiplexer cone is part of a multiplexer cone bus.

7. A method of factorizing multiplexer circuitry in a multiplexer cone, said method comprising:
   selecting a plurality of electrically equivalent data inputs and corresponding multiplexers in said multiplexer cone;
   eliminating said plurality of electrically equivalent data inputs and said corresponding multiplexers;
   adding a new multiplexer at a point within said multiplexer cone, wherein said new multiplexer receives at least one of said plurality of electrically equivalent data inputs; and
   adding new selection circuitry coupled to said new multiplexer.

8. The method of claim 7 wherein said point is located between each of said plurality of electrically equivalent data inputs and an output of said multiplexer cone.

9. The method of claim 8 further wherein:
   a logical function of said multiplexer cone bus is unchanged by said selecting, said eliminating, said adding said new multiplexer, and said adding said new selection circuitry.

10. The method of claim 9 wherein said point is a point where a cost of said added selection circuitry is minimized.

11. The method of claim 7 wherein:
   said multiplexer cone is part of a multiplexer cone bus; and
   said selecting, said eliminating, and said adding said new multiplexer are performed in each multiplexer cone of said multiplexer cone bus.

12. The method of claim 11 wherein:
   said new selection circuitry generates a selection output; and
   each new multiplexer of said multiplexer cone bus receives said selection output.

13. The method of claim 12 further comprising:
   determining whether said eliminating, said adding said new multiplexer, and said adding said new selection circuitry would reduce a cost of said multiplexer cone bus, wherein:
   said eliminating, said adding said new multiplexer, and said adding said new selection circuitry are performed only if said cost would be reduced.

* * * * *